United States Patent
Camacho

(10) Patent No.: US 8,420,448 B2
(45) Date of Patent: Apr. 16, 2013

(54) INTEGRATED CIRCUIT PACKAGING SYSTEM WITH PADS AND METHOD OF MANUFACTURE THEREOF

(75) Inventor: Zigmund Ramirez Camacho, Singapore (SG)

(73) Assignee: STATS Chippac Ltd., Singapore (SG)

( * ) Notice: Subject to any disclaimer, the term of this patent is extended or adjusted under 35 U.S.C. 154(b) by 27 days.

(21) Appl. No.: 13/071,449

(22) Filed: Mar. 24, 2011

(65) Prior Publication Data

US 2012/0241948 A1 Sep. 27, 2012

(51) Int. Cl.
H01L 21/00 (2006.01)

(52) U.S. Cl.
USPC .......................................................... 438/123

(58) Field of Classification Search .................... 438/123
See application file for complete search history.

(56) References Cited

U.S. PATENT DOCUMENTS 6,159,770 A * 12/2000 Tetaka et al. ................... 438/112
7,049,177 B1 * 5/2006 Fan et al. ....................... 438/123
2002/0025607 A1 * 2/2002 Danno et al. .................. 438/126
2006/0003483 A1 * 1/2006 Wolff et al. ...................... 438/65
2006/0180904 A1 * 8/2006 Ong ............................... 257/676
2007/0059863 A1     3/2007 Li et al.

OTHER PUBLICATIONS

U.S. Appl. No. 12/639,997, filed Dec. 17, 2009, Yang et al.

* cited by examiner

*Primary Examiner* — Charles Garber
*Assistant Examiner* — Andre' C Stevenson
(74) *Attorney, Agent, or Firm* — Ishimaru & Associates LLP

(57) ABSTRACT

A method of manufacture of an integrated circuit packaging system includes: providing a lead frame having a frame platform and a frame base; forming an elevated paddle on the frame platform and a base pad on the frame base; mounting an integrated circuit over the elevated paddle; forming an encapsulation on the lead frame and over the elevated paddle, the base pad, the integrated circuit, and the internal interconnect; and removing the lead frame to expose an encapsulation recess and an encapsulation base with the base pad exposed along the encapsulation base and the elevated paddle exposed in the encapsulation recess.

20 Claims, 5 Drawing Sheets

INTEGRATED CIRCUIT PACKAGING SYSTEM WITH PADS AND METHOD OF MANUFACTURE THEREOF

TECHNICAL FIELD

The present invention relates generally to an integrated circuit packaging system, and more particularly to a system for an integrated circuit packaging system with pads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is increasingly critical that answers be found for these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead frame having a frame platform and a frame base; forming an elevated paddle on the frame platform and a base pad on the frame base; mounting an integrated circuit over the elevated paddle; forming an encapsulation on the lead frame and over the elevated paddle, the base pad, the integrated circuit, and the internal interconnect; and removing the lead frame to expose an encapsulation recess and an encapsulation base with the base pad exposed along the encapsulation base and the elevated paddle exposed in the encapsulation recess.

The present invention provides an integrated circuit packaging system, including: an elevated paddle; an integrated circuit on the elevated paddle; a base pad adjacent to and down set from the elevated paddle; and an encapsulation, having an encapsulation recess in an encapsulation base, over the integrated circuit and the internal interconnect, the elevated paddle exposed in the encapsulation recess and the base pad exposed along the encapsulation base.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
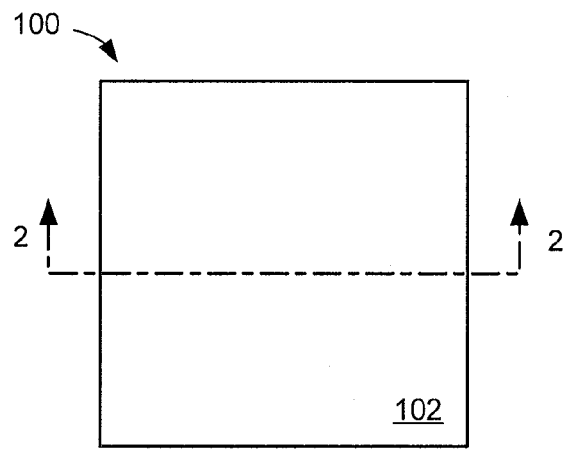
FIG. 1 is a top view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view on an integrated circuit packaging system 100 in a first embodiment of the present invention. The top view depicts an encapsulation 102. The encapsulation 102 is a cover, such as a protective covering, that provides structural rigidity and maintains placement of and provide environmental protection to components within the integrated circuit packaging system 100. As an example, the encapsulation 102 can be formed by molding an encapsulation material such as epoxy molding compound or ceramic material.

For illustrative purposes, the integrated circuit packaging system 100 is shown with the encapsulation 102 having a square geometric shape although it is understood that the encapsulation 102 can have a different geometric shape. For example, the encapsulation 102 can have a rectangular geometric shape or an octagonal geometric shape.

Figure 2:
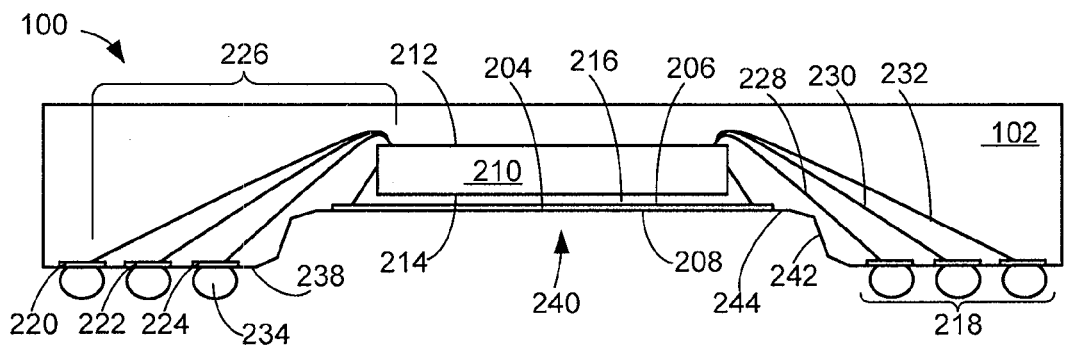
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts an elevated paddle 204 having a paddle first side 206 and a paddle second side 208. The elevated paddle 204 is a structure made from at least one metal layer for mounting a device, such as an integrated circuit device, a heat sink for a device, or a combination thereof.

As an example, the elevated paddle 204 can be made from at least one layer of a metallic material formed by a plating process. More specifically, the elevated paddle 204 can be made from a single metallic layer made from plating a single material, multiple metallic layers made from plating a single material, or multiple metallic layers made from plating different materials. As a specific example, the elevated paddle 204 can be formed with gold, palladium, nickel, silver, tin, an alloy, or a combination thereof. As a further example, the elevated paddle 204 is not attached to support structures, such as tie bars or lead frames.

Figure 8:
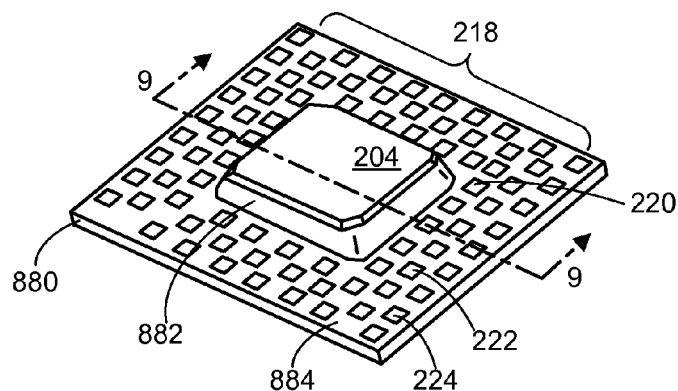
FIG. 8 is an isometric top view of a lead frame in a plating phase.

The elevated paddle 204 can have the characteristics of having a fabrication support structure removed. Fabrication support structure is a structure used in production of the integrated circuit packaging system 100 to build up and mount components, which is subsequently removed, such as a frame as shown in FIG. 8 below. The characteristics of the fabrication support structure removed can include physical features, such as acid corrosion, irregularities in the surface, or a chemically processed surface.

An integrated circuit 210 can be mounted over the elevated paddle 204. The integrated circuit 210 is a semiconductor device having active circuitry (not shown) fabricated thereto. As an example, the integrated circuit 210 can be an integrated circuit die, a thin integrated circuit die, an ultrathin integrated circuit die, or a wire-bonded integrated circuit die. As a further example, the elevated paddle 204 can function as a heat sink to remove heat from the integrated circuit 210.

The integrated circuit 210 can have an active side 212 and a non-active side 214. The active side 212 of the integrated circuit 210 can have the active circuitry (not shown) fabricated thereto. The integrated circuit 210 can be mounted over the paddle first side 206. The non-active side 214 can face the paddle first side 206 and the active side 212 can face away from the paddle first side 206.

An adhesive 216 can be over the paddle first side 206. The adhesive 216 is an adhesive material for bonding components. As an example, the adhesive 216 can be a thermally conductive adhesive material, a polymer based adhesive material, or any other adhesive material suitable for bonding components. The integrated circuit 210 can be mounted over the elevated paddle 204 with the adhesive 216 in between.

The integrated circuit packaging system 100 can include base pads 218. The base pads 218 are conductive structures made from at least one metal layer for providing electrical connection to components or systems external to the integrated circuit packaging system 100. The base pads 218 can be adjacent to and down set from the elevated paddle 204.

As an example, the base pads 218 can be made from at least one layer of a metallic material formed by a plating process. More specifically, the base pads 218 can be made from a single metallic layer made from plating a single material, multiple metallic layers made from plating a single material, multiple metallic layers made from plating different materials, or a number of layers similar to the elevated paddle 204. As a specific example, the base pads 218 can be formed with gold, palladium, nickel, silver, tin, an alloy, or a combination thereof, or from the same material as the elevated paddle 204.

The base pads 218 can have the characteristics of the fabrication support structure removed. The characteristics of the fabrication support structure removed can include physical features, such as acid corrosion, irregularities in the surface, or a chemically processed surface.

The base pads 218 can include a first base pad 220, a second base pad 222, and a third base pad 224. The first base pad 220 can be adjacent to and down-set from the elevated paddle 204.

The second base pad 222 can be adjacent to and co-planar with the first base pad 220. The second base pad 222 can be on the side of the first base pad 220 opposite the elevated paddle 204.

The third base pad 224 can be adjacent to the second base pad 222. The third base pad 224 can be co-planar with the first base pad 220 and the second base pad 222. The third base pad 224 can be on a side of the second base pad 222 that is opposite the first base pad 220. The second base pad 222 can be between the first base pad 220 and the third base pad 224.

For illustrative purposes, the integrated circuit packaging system 100 is shown having the base pads 218 including the first base pad 220, the second base pad 222, and the third base pad 224, although it is understood that the integrated circuit packaging system 100 can have a different number of the base pads 218. For example, the integrated circuit packaging system 100 can have only the first base pad 220 and the second base pad 222. As a further example, the integrated circuit packaging system 100 can include additional base pads 218, such as a fourth or fifth base pad, beyond the third base pad 224.

The integrated circuit packaging system 100 can include internal interconnects 226. The internal interconnects 226 are conductive interconnects for electrical interconnection of devices and structures. As an example, the internal interconnects 226 can be bond wires or ribbon bond wires.

The internal interconnects 226 can include a first internal interconnect 228, a second internal interconnect 230, and a third internal interconnect 232. The first internal interconnect 228 can connect between the active side 212 of the integrated circuit 210 and the first base pad 220. The second internal interconnect 230 can connect between the active side 212 and the second base pad 222. The third internal interconnect 232 can connect between the active side 212 and the third base pad 224.

External interconnects 234 can be attached to the first base pad 220, the second base pad 222, and the third base pad 224. The external interconnects 234 are conductive interconnects for connecting the integrated circuit packaging system 100 to a next system level down. As an example, the external interconnects 234 can be solder balls, solder bumps, or conductive bumps. The external interconnects 234 can be attached to the side of the first base pad 220, the second base pad 222, and the third base pad 224 opposite the first internal interconnect 228, the second internal interconnect 230, and the third internal interconnect 232, respectively.

The encapsulation 102 can cover the elevated paddle 204, the base pads 218, including the first base pad 220, the second base pad 222, and the third base pad 224. The encapsulation 102 can cover the integrated circuit 210, and the adhesive 216, and the internal interconnects 226 including the first internal interconnect 228, the second internal interconnect 230, the third internal interconnect 232.

In the absence of a rigid base structure, such as a substrate or a circuit board, the encapsulation 102 is the primary structure providing rigidity for the integrated circuit packaging system 100. The encapsulation 102 also maintains positioning and location of the elements within the integrated circuit packaging system 100, such as the base pads 218 and the elevated paddle 204.

The encapsulation 102 can have an encapsulation base 238. The base pads 218, including the first base pad 220, the second base pad 222, and the third base pad 224, can be exposed along the encapsulation base 238. The exposed portion of the base pads 218 can be co-planar with the encapsulation base 238.

The encapsulation 102 can have an encapsulation recess 240. The encapsulation recess 240 is a space in the encapsulation 102 having dimensions to accommodate a device, such as a packaged integrated circuit within the encapsulation recess 240.

The encapsulation recess 240 can be along the encapsulation base 238. The encapsulation recess 240 can be located in the central portion of the encapsulation base 238 and between the first base pad 220 and another of the first base pad 220.

The encapsulation recess 240 can have a recess side 242 and a recessed surface 244. The recess side 242 can be between the recessed surface 244 and the encapsulation base 238. The recessed surface 244 can be parallel with the encapsulation base 238.

The recess side 242 can have characteristics of the support structure removed. The characteristics of the support structure removed include physical features, such imprints or artifacts due to stress marks from deformed materials.

The elevated paddle 204 can be exposed in the encapsulation recess 240. More specifically, the paddle second side 208 can be exposed along the recessed surface 244. The paddle second side 208 can be co-planar with the recessed surface 244.

It has been discovered that the present invention provides the integrated circuit packaging system 100 having a reduced package profile. The base pads 218, including the first base pad 220, the second base pad 222, and the third base pad 224, exposed from the encapsulation base 238 eliminates the need for a support structure, such as a substrate or circuit board, thus reducing the overall package profile.

It has also been discovered that the present invention provides the integrated circuit packaging system 100 having improved reliability. The base pads 218 exposed along the encapsulation base 238 facilitates direct testing of the package and enables manufactures determine if the integrated circuit packaging system 100 is a known good device, thereby improving the reliability of the integrated circuit packaging system 100.

It has further been discovered that the present invention provides the integrated circuit packaging system 100 having improved reliability. The encapsulation 102 provides structural rigidity without the need of a base support structure, such as a substrate or a printed circuit board, thus eliminating any potential delamination due to differences in coefficient of thermal expansion between the encapsulation 102 and the base support structure, thus improving reliability.

It has yet further been discovered that the present invention provides the integrated circuit packaging system 100 having increased input/output (I/O). The base pads 218, formed by a plating process, can be arranged with less space between each of the base pads 218 compared to conventional packaging interfaces, such as exposed leads and pads on substrates, thus the base pads 218 provides the integrated circuit packaging system having an increased number of I/O.

Figure 3:
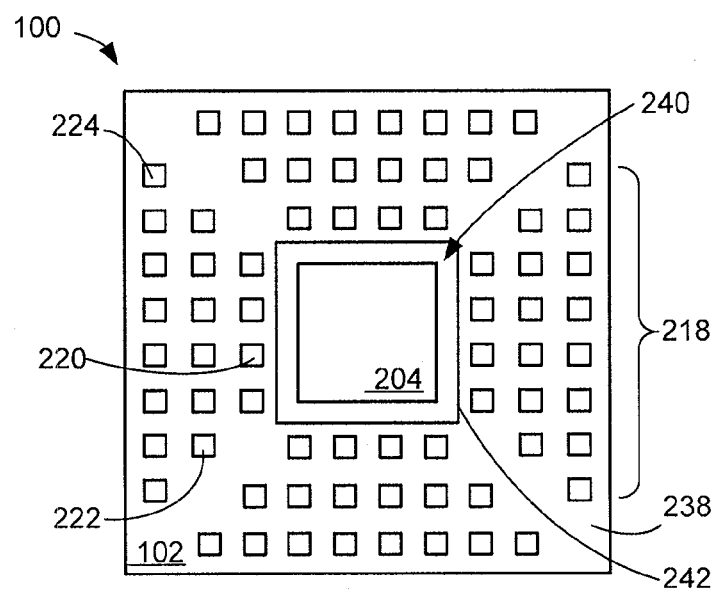
FIG. 3 is bottom view of the integrated circuit packaging system.

Referring now to FIG. 3, therein is shown a bottom view of the integrated circuit packaging system 100. The bottom view depicts the encapsulation recess 240 of the encapsulation 102 at the central portion of the encapsulation base 238. The encapsulation base 238 can surround the encapsulation recess 240. The elevated paddle 204 can be exposed in the encapsulation recess 240. The recess side 242 extends between the elevated paddle 204 and the encapsulation base 238 and around the encapsulation recess 240. The recess side 242 is non-horizontal and continuously exposed around the encapsulation recess 240.

For illustrative purposes, the integrated circuit packaging system 100 is shown with the encapsulation recess 240 having a square geometric shape although it is understood that the encapsulation recess 240 can have a different geometric shape. For example, the encapsulation recess 240 can have a rectangular geometric shape, an octagonal geometric shape, or any geometric shape that is suitable for accommodating the device.

The base pads 218, including the first base pad 220, the second base pad 222, and the third base pad 224, can be exposed from the encapsulation base 238. The base pads 218 can surround the encapsulation recess 240. The first base pad 220 can be adjacent to the encapsulation recess 240. As an example, a number of the first base pad 220 can be formed in rows surrounding the encapsulation recess 240.

The second base pad 222 can be adjacent to the first base pad 220 and on the side of the first base pad 220 opposite the elevated paddle 204. As an example, a number of the second base pad 222 can be in rows surrounding the rows of the first base pad 220.

The third base pad 224 can be adjacent to the second base pad 222 and on the side of the second base pad 222 opposite the first base pad 220. The second base pad 222 can be between the first base pad 220 and the third base pad 224. As an example, a number of the third base pad 224 can be in rows surrounding the rows of the second base pad 222.

Figure 4:
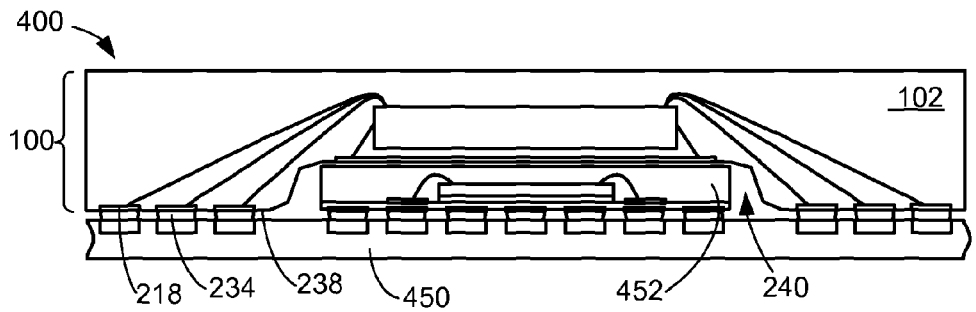
FIG. 4 is a cross-sectional view of an integrated circuit package-on-package system as exemplified by the top view of FIG. 1 along line 2-2 of FIG. 1 in a second embodiment of the present invention.

Referring now to FIG. 4, therein is shown a cross-sectional view of an integrated circuit package-on-package system 400 as exemplified by the top view of FIG. 1 along line 2-2 of FIG. 1 in a second embodiment of the present invention. The cross-sectional view depicts the integrated circuit packaging system 100 mounted over a base substrate 450. The base substrate 450 is a rigid base structure that provides support and connectivity for mounting other components and devices. As an example, the base substrate can be made from conductive material, such as copper or other metals, ceramic material, semi-conducting material, such as silicon, a laminated structure having vias and metal layers (not shown), or a combination thereof. As a specific example, the base substrate 450 can be a printed circuit board.

A base device 452 can be mounted over the base substrate 450. The base device 452 is a device having active or passive components. For example, the base device 452 can be a packaged integrated circuit, a flip chip, a flip chip stack, or one or more passive components.

The integrated circuit packaging system 100 can be mounted over the base substrate 450 with the base device 452 in the encapsulation recess 240. The encapsulation base 238 of the encapsulation 102 can face and be mounted over the base substrate 450. The base pads 218 can be connected to the base substrate 450 with the external interconnects 234.

It has been discovered that the present invention provides the integrated circuit package-on-package system 400 having a low package profile when stacked in a package on package configuration. The base device 452 mounted on the base substrate 450 and in the encapsulation recess 240 reduces the overall profile of a package on package system. In addition, the encapsulation recess 240 enables a low package on package system profile by reducing the size of the external interconnects 234 necessary to provide an adequate stand-off height in a package on package configuration.

Figure 5:
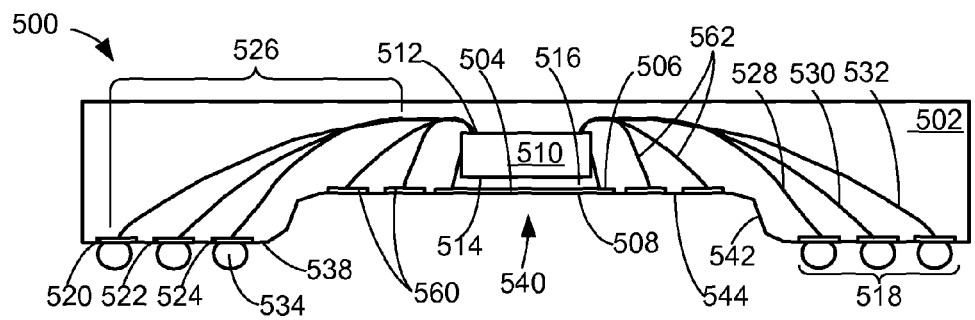
FIG. 5 is a cross-sectional view of an integrated circuit packaging system as exemplified by the top view of FIG. 1 along line 2-2 of FIG. 1 in a third embodiment of the present invention.

Referring now to FIG. 5, therein is shown a cross-sectional view of an integrated circuit packaging system 500 as exemplified by the top view of FIG. 1 along line 2-2 of FIG. 1 in a third embodiment of the present invention. The cross-sectional view depicts an elevated paddle 504 having a paddle first side 506 and a paddle second side 508. The elevated paddle 504 is a structure made from at least one metal layer for mounting a device, such as an integrated circuit device, a heat sink for a device, or a combination thereof.

As an example, the elevated paddle 504 can be made from at least one layer of a metallic material formed by a plating process. More specifically, the elevated paddle 504 can be made from a single metallic layer made from plating a single material, multiple metallic layers made from plating a single material, or multiple metallic layers made from plating different materials. As a specific example, the elevated paddle 504 can be formed with gold, palladium, nickel, silver, tin, an alloy, or a combination thereof. As a further example, the elevated paddle 504 is not attached to support structures, such as tie bars or lead frames.

The elevated paddle 504 can have the characteristics of having a fabrication support structure removed. Fabrication support structure is a structure used in production of the integrated circuit packaging system 500 to build up and mount components, which is subsequently removed, such as a frame as shown in FIG. 8 below. The characteristics of the fabrication support structure removed can include physical features, such as acid corrosion, irregularities in the surface, or a chemically processed surface.

An integrated circuit 510 can be mounted over the elevated paddle 504. The integrated circuit 510 is a semiconductor device having active circuitry (not shown) fabricated thereto. As an example, the integrated circuit 510 can be an integrated circuit die, a thin integrated circuit die, an ultrathin integrated circuit die, or a wire-bonded integrated circuit die. As a further example, the elevated paddle 504 can function as a heat sink to remove heat from the integrated circuit 510.

The integrated circuit 510 can have an active side 512 and a non-active side 514. The active side 512 of the integrated circuit 510 can have the active circuitry (not shown) fabricated thereto. The integrated circuit 510 can be mounted over the paddle first side 506. The non-active side 514 can face the paddle first side 506 and the active side 512 can face away from the paddle first side 506.

An adhesive 516 can be over the paddle first side 506. The adhesive 516 is an adhesive material for bonding components. As an example, the adhesive 516 can be a thermally conductive adhesive material, a polymer based adhesive material, or any other adhesive material suitable for bonding components. The integrated circuit 510 can be mounted over the elevated paddle 504 with the adhesive 516 in between.

The integrated circuit packaging system 500 can include elevated pads 560. The elevated pads 560 are conductive structures made from at least one metal layer for providing electrical connection to a device to the integrated circuit packaging system 500. The elevated pads 560 can be on the same horizontal plane with and adjacent to the elevated paddle 504.

The integrated circuit packaging system 500 can include base pads 518. The base pads 518 are conductive structures made from at least one metal layer for providing electrical connection to components or systems external to the integrated circuit packaging system 500. The base pads 518 can be adjacent to and down set from the elevated paddle 504.

As an example, the elevated pads 560 and the base pads 518 can be made from at least one layer of a metallic material formed by a plating process. More specifically, the elevated pads 560 and the base pads 518 can be made from a single metallic layer made from plating a single material, multiple metallic layers made from plating a single material, multiple metallic layers made from plating different materials, or a number of layers similar to the elevated paddle 504. As a specific example, the elevated pads 560 and the base pads 518 can be formed with gold, palladium, nickel, silver, tin, an alloy, or a combination thereof, or from the same material as the elevated paddle 504.

The elevated pads 560 and the base pads 518 can have the characteristics of the fabrication support structure removed. The characteristics of the fabrication support structure removed can include physical features, such as acid corrosion, irregularities in the surface, or a chemically processed surface.

The base pads 518 can include a first base pad 520, a second base pad 522, and a third base pad 524. The first base pad 520 can be adjacent to and down-set from the elevated paddle 504.

The second base pad 522 can be adjacent to and co-planar with the first base pad 520. The second base pad 522 can be on the side of the first base pad 520 opposite the elevated paddle 504.

The third base pad 524 can be adjacent to the second base pad 522. The third base pad 524 can be co-planar with the first base pad 520 and the second base pad 522. The third base pad 524 can be on a side of the second base pad 522 that is opposite the first base pad 520. The second base pad 522 can be between the first base pad 520 and the third base pad 524.

For illustrative purposes, the integrated circuit packaging system 500 is shown having the base pads 518 including the first base pad 520, the second base pad 522, and the third base pad 524, although it is understood that the integrated circuit packaging system 500 can have a different number of the base pads 518. For example, the integrated circuit packaging system 500 can have only the first base pad 520 and the second base pad 522. As a further example, the integrated circuit packaging system 500 can include additional base pads 518, such as a fourth or fifth base pad, beyond the third base pad 524.

The integrated circuit packaging system 500 can include elevated interconnects 562. The elevated interconnects 562 are conductive interconnects for electrical interconnection of devices and structures. As an example, the elevated interconnects 562 can be bond wires or ribbon bond wires. The elevated interconnects 562 can connect between the active side 512 of the integrated circuit 510 and the elevated pads 560.

The integrated circuit packaging system 500 can include internal interconnects 526. The internal interconnects 526 are conductive interconnects for electrical interconnection of devices and structures. As an example, the internal interconnects 526 can be bond wires or ribbon bond wires.

The internal interconnects 526 can include a first internal interconnect 528, a second internal interconnect 530, and a third internal interconnect 532. The first internal interconnect 528 can connect between the active side 512 of the integrated circuit 510 and the first base pad 520. The second internal interconnect 530 can connect between the active side 512 and the second base pad 522. The third internal interconnect 532 can connect between the active side 512 and the third base pad 524.

External interconnects 534 can be attached to the first base pad 520, the second base pad 522, and the third base pad 524. The external interconnects 534 are conductive interconnects for connecting the integrated circuit packaging system 500 to a next system level down. As an example, the external interconnects 534 can be solder balls, solder bumps, or conductive bumps. The external interconnects 534 can be attached to the side of the first base pad 520, the second base pad 522, and the third base pad 524 opposite the first internal interconnect 528, the second internal interconnect 530, and the third internal interconnect 532, respectively.

The integrated circuit packaging system 500 can include an encapsulation 502. The encapsulation 502 is a cover, such as a protective covering, that provides structural rigidity and maintains placement of and provide environmental protection to components within the integrated circuit packaging system 500. As an example, the encapsulation 502 can be formed by molding an encapsulation material such as epoxy molding compound or ceramic material.

The encapsulation 502 can cover the elevated paddle 504, the elevated pads 560, and the base pads 518, including the first base pad 520, the second base pad 522, and the third base pad 524. The encapsulation 502 can cover the integrated circuit 510, and the adhesive 516, the elevated interconnects 562, and the internal interconnects 526 including the first internal interconnect 528, the second internal interconnect 530, the third internal interconnect 532.

In the absence of a rigid base structure, such as a substrate or a circuit board, the encapsulation 502 is the primary structure providing rigidity for the integrated circuit packaging system 500. The encapsulation 502 also maintains positioning and location of the elements within the integrated circuit packaging system 500, such as the base pads 518 and the elevated paddle 504.

The encapsulation 502 can have an encapsulation base 538. The base pads 518, including the first base pad 520, the second base pad 522, and the third base pad 524, can be exposed along the encapsulation base 538. The exposed portion of the base pads 518 can be co-planar with the encapsulation base 538.

The encapsulation 502 can have an encapsulation recess 540. The encapsulation recess 540 is a space in the encapsulation 502 having dimensions to accommodate a device, such as a packaged integrated circuit or a quad flat no lead package, within the encapsulation recess 540.

The encapsulation recess 540 can be along the encapsulation base 538. The encapsulation recess 540 can be located in the central portion of the encapsulation base 538 and between the first base pad 520 and another of the first base pad 520.

The encapsulation recess 540 can have a recess side 542 and a recessed surface 544. The recess side 542 can be between the recessed surface 544 and the encapsulation base 538. The recessed surface 544 can be parallel with the encapsulation base 538.

The recess side 542 can have characteristics of the support structure removed. The characteristics of the support structure removed include physical features, such imprints or artifacts due to stress marks from deformed materials.

The elevated paddle 504 and the elevated pads 560 can be exposed in the encapsulation recess 540. More specifically, the paddle second side 508 can be exposed along the recessed surface 544. The paddle second side 508 and the exposed portion of the elevated pads 560 can be co-planar each other and with the recessed surface 544.

It has been discovered that the present invention provides the integrated circuit packaging system 500 having increased connectivity. The elevated pads 560 increase connectivity which enables attachment of additional devices in the encapsulation recess 540 of the integrated circuit packaging system 500.

Figure 6:
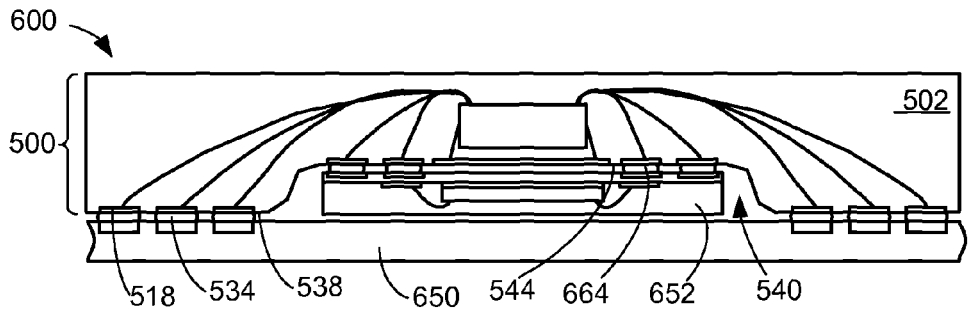
FIG. 6 is a cross-sectional view of an integrated circuit package-on-package system as exemplified by the top view of FIG. 1 along by line 2-2 of FIG. 1 in a fourth embodiment of the present invention.

Referring now to FIG. 6, therein is shown a cross-sectional view of an integrated circuit package-on-package system 600 as exemplified by the top view of FIG. 1 along line 2-2 of FIG. 1 in a fourth embodiment of the present invention. The cross-sectional view depicts the integrated circuit packaging system 500 mounted over a base substrate 650. The base substrate 650 is a rigid base structure that provides support and connectivity for mounting other components and devices. As an example, the base substrate can be made from conductive material, such as copper or other metals, ceramic material, semi-conducting material, such as silicon, a laminated structure having vias and metal layers (not shown), or a combination thereof. As a specific example, the base substrate 650 can be a printed circuit board.

A base device 652 can be attached to the integrated circuit packaging system 500. The base device 652 is a device having active or passive components. For example, the base device 652 can be a packaged integrated circuit, a flip chip, a flip chip stack, or one or more passive components. The base device 652 can be connected in and along the recessed surface 544 of the encapsulation recess 540.

The integrated circuit packaging system 500 can be mounted over the base substrate 650 with the base device 652 in the encapsulation recess 540. The encapsulation base 538 of the encapsulation 502 can face and be mounted over the base substrate 650. The base pads 518 can be connected to the base substrate 650 with the external interconnects 534.

The base device 652 can be connected to the elevated pads 560 in the encapsulation recess 540 with mounting interconnects 664. The mounting interconnects 664 are conductive connectors for physically and electrically connecting devices and components. As an example, the mounting interconnects 664 can be solder balls, solder bumps, or conductive bumps.

Figure 7:
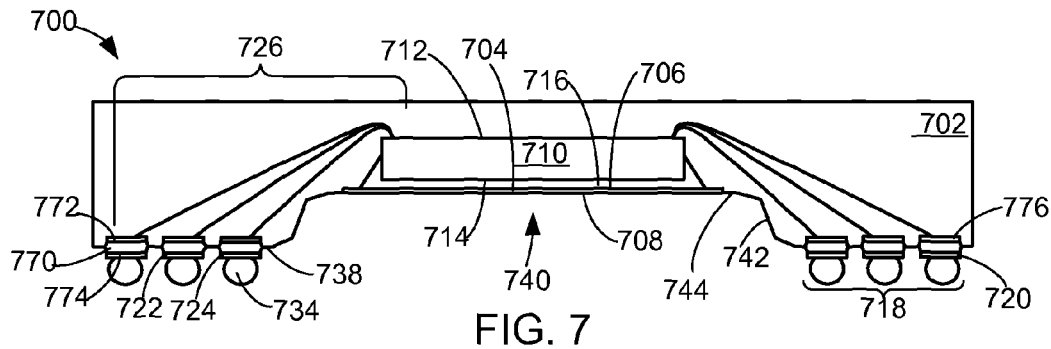
FIG. 7 is a cross-sectional view of an integrated circuit packaging system as exemplified by the top view of FIG. 1 along line 2-2 of FIG. 1 in a fifth embodiment of the present invention.

Referring now to FIG. 7, therein is shown a cross-sectional view of an integrated circuit packaging system 700 as exemplified by the top view of FIG. 1 along line 2-2 of FIG. 1 in a fifth embodiment of the present invention. The cross-sectional view depicts an elevated paddle 704 having a paddle first side 706 and a paddle second side 708. The elevated paddle 704 is a structure made from at least one metal layer for mounting a device, such as an integrated circuit device, a heat sink for a device, or a combination thereof.

As an example, the elevated paddle 704 can be made from at least one layer of a metallic material formed by a plating process. More specifically, the elevated paddle 704 can be made from a single metallic layer made from plating a single material, multiple metallic layers made from plating a single material, or multiple metallic layers made from plating different materials. As a specific example, the elevated paddle 704 can be formed with gold, palladium, nickel, silver, tin, an alloy, or a combination thereof. As a further example, the elevated paddle 704 is not attached to support structures, such as tie bars or lead frames.

The elevated paddle 704 can have the characteristics of having a fabrication support structure removed. Fabrication support structure is a structure used in production of the integrated circuit packaging system 700 to build up and mount components, which is subsequently removed, such as a frame as shown in FIG. 8 below. The characteristics of the fabrication support structure removed can include physical features, such as acid corrosion, irregularities in the surface, or a chemically processed surface.

An integrated circuit 710 can be mounted over the elevated paddle 704. The integrated circuit 710 is a semiconductor device having active circuitry (not shown) fabricated thereto. As an example, the integrated circuit 710 can be an integrated circuit die, a thin integrated circuit die, an ultrathin integrated circuit die, or a wire-bonded integrated circuit die. As a further example, the elevated paddle 704 can function as a heat sink to remove heat from the integrated circuit 710.

The integrated circuit 710 can have an active side 712 and a non-active side 714. The active side 712 of the integrated circuit 710 can have the active circuitry (not shown) fabricated thereto. The integrated circuit 710 can be mounted over the paddle first side 706. The non-active side 714 can face the paddle first side 706 and the active side 712 can face away from the paddle first side 706.

An adhesive 716 can be over the paddle first side 706. The adhesive 716 is an adhesive material for bonding components. As an example, the adhesive 716 can be a thermally conductive adhesive material, a polymer based adhesive material, or any other adhesive material suitable for bonding components. The integrated circuit 710 can be mounted over the elevated paddle 704 with the adhesive 716 in between.

The integrated circuit packaging system 700 can include pillars 770. The pillars 770 are conductive support structures that can provide anchoring of contact pads. The pillars 770 can be adjacent to and down set from the elevated paddle 704. The pillars 770 can have an inner side 772 and an outer side 774.

Inner pads 776 can be on the inner side 772 of the pillars 770 and base pads 718 can be on the outer side 774 of the pillars 770. The inner pads 776 and the base pads 718 are conductive structures made from at least one metal layer for providing electrical connection to components or systems external to the integrated circuit packaging system 700. The base pads 718 can be adjacent to and down set from the elevated paddle 704.

As an example, the inner pads 776 and the base pads 718 can be made from at least one layer of a metallic material formed by a plating process. More specifically, the inner pads 776 and the base pads 718 can be made from a single metallic layer made from plating a single material, multiple metallic layers made from plating a single material, multiple metallic layers made from plating different materials, or a number of layers similar to the elevated paddle 704. As a specific example, the inner pads 776 and the base pads 718 can be formed with gold, palladium, nickel, silver, tin, an alloy, or a combination thereof, or from the same material as the elevated paddle 704.

The base pads 718 can include a first base pad 720, a second base pad 722, and a third base pad 724. The first base pad 720 can be adjacent to and down-set from the elevated paddle 704.

The second base pad 722 can be adjacent to and co-planar with the first base pad 720. The second base pad 722 can be on the side of the first base pad 720 opposite the elevated paddle 704.

The third base pad 724 can be adjacent to the second base pad 722. The third base pad 724 can be co-planar with the first base pad 720 and the second base pad 722. The third base pad 724 can be on a side of the second base pad 722 that is opposite the first base pad 720. The second base pad 722 can be between the first base pad 720 and the third base pad 724.

Internal interconnects 726 can connect between the active side 712 of the integrated circuit 710 and the inner pads 776. The internal interconnects 726 are conductive interconnects for electrical interconnection of devices and structures. As an example, the internal interconnects 726 can be bond wires or ribbon bond wires.

External interconnects 734 can be attached to the first base pad 720, the second base pad 722, and the third base pad 724. The external interconnects 734 are conductive interconnects for connecting the integrated circuit packaging system 700 to a next system level down. As an example, the external interconnects 734 can be solder balls, solder bumps, or conductive bumps. The external interconnects 734 can be attached to the side of the first base pad 720, the second base pad 722, and the third base pad 724 facing away from the pillars 770.

The integrated circuit packaging system 700 can include an encapsulation 702. The encapsulation 702 is a cover, such as a protective covering, that provides structural rigidity and maintains placement of and provide environmental protection to components within the integrated circuit packaging system 700. As an example, the encapsulation 702 can be formed by molding an encapsulation material such as epoxy molding compound or ceramic material.

The encapsulation 702 can cover the elevated paddle 704, the inner pads 776, the integrated circuit 710, the adhesive 716, and the internal interconnects 726. The encapsulation 702 can partially cover the pillars 770.

In the absence of a rigid base structure, such as a substrate or a circuit board, the encapsulation 702 is the primary structure providing rigidity for the integrated circuit packaging system 700. The encapsulation 702 also maintains positioning and location of the elements within the integrated circuit packaging system 700, such as the base pads 718 and the elevated paddle 704.

The encapsulation 702 can have an encapsulation base 738. A portion of the pillars 770 can protrude from the encapsulation base 738. The base pads 718, including the first base pad 720, the second base pad 722, and the third base pad 724, can be exposed along the encapsulation base 738.

The encapsulation 702 can have an encapsulation recess 740. The encapsulation recess 740 is a space in the encapsulation 702 having dimensions to accommodate a device, such as a packaged integrated circuit within the encapsulation recess 740.

The encapsulation recess 740 can be along the encapsulation base 738. The encapsulation recess 740 can be located in the central portion of the encapsulation base 738.

The encapsulation recess 740 can have a recess side 742 and a recessed surface 744. The recess side 742 can be between the recessed surface 744 and the encapsulation base 738. The recessed surface 744 can be parallel with the encapsulation base 738.

The recess side 742 can have characteristics of the support structure removed. The characteristics of the support structure removed include physical features, such imprints or artifacts due to stress marks from deformed materials.

The elevated paddle 704 can be exposed in the encapsulation recess 740. More specifically, the paddle second side 708 can be exposed along the recessed surface 744. The paddle second side 708 can be co-planar with the recessed surface 744.

Referring now to FIG. 8, therein is shown an isometric top view of a lead frame 880 in a plating phase. The lead frame 880 is a malleable base structure that also provides sufficient rigidity to support build up and attachment of components for forming an integrated circuit packaging system. The lead frame 880 can also have properties that can be removed through processes, such as etching, without damaging or removing components or structures formed over the lead frame 880.

As an example, the lead frame 880 can be a structure formed from metals, such as copper, a copper alloy, or other alloys. As a further example, the lead frame 880 can be made from a single continuous piece of material without cutouts, openings, or tie bars.

The lead frame 880 can include a frame platform 882 and a frame base 884. The frame platform 882 is a portion of the lead frame 880 that is raised above a horizontal plane of the frame base 884. The frame platform 882 can be formed along a central portion of the lead frame 880. The frame base 884 can include the frame platform 882.

The elevated paddle 204 can be formed on the frame platform 882. The elevated paddle 204 can be formed over a central portion of the frame platform 882.

The elevated paddle 204 can be formed in a number of different ways. For example, the elevated paddle 204 can be formed by a plating or layering process, such as chemical vapor deposition, electroplating, physical vapor deposition, sputtering, or spraying processes.

The base pads 218 can be formed on the frame base 884. The first base pad 220 can be formed adjacent to and down set from the elevated paddle 204. As an example, a number of the first base pad 220 can be formed in rows on the frame base 884 and surrounding the frame platform 882.

The second base pad 222 can be formed adjacent to the first base pad 220 and on the side of the first base pad 220 opposite the elevated paddle 204. As an example, a number of the second base pad 222 can be formed in rows on the frame base 884 and surrounding the rows of the first base pad 220.

The third base pad 224 can be formed adjacent to the second base pad 222 and on the side of the second base pad 222 opposite the first base pad 220. The second base pad 222 can be between the first base pad 220 and the third base pad 224. As an example, a number of the third base pad 224 can be formed in rows on the frame base 884 and surrounding the rows of the second base pad 222.

Similarly, the elevated pads 560 of FIG. 5 can be formed along the frame platform 882. The elevated pads 560 can be formed on the frame platform 882 adjacent to the elevated paddle 204.

The base pads 218 and the elevated pads 560 can be formed in a number of different ways. For example, the base pads 218 and the elevated pads 560 can be formed by a plating or layering process, such as chemical vapor deposition, electroplating, physical vapor deposition, sputtering, spraying processes, or by a process that is the same or similar to the process used to form the elevated paddle 204. As a further example, the base pads 218 can be formed at the same time that the elevated paddle 204 is formed or, alternatively, the base pads 218 can be formed before or after the elevated paddle 204 is formed.

Figure 9:
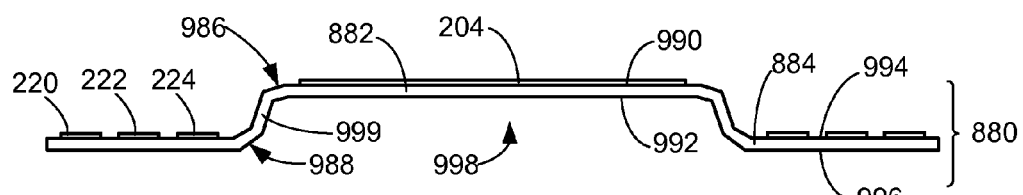
FIG. 9 is a cross-sectional view of the lead frame of FIG. 8 along line 9-9.

Referring now to FIG. 9, therein is shown a cross-sectional view of the lead frame 880 of FIG. 8 along line 9-9. The cross-sectional view depicts the lead frame 880 having the frame platform 882 and the frame base 884. The lead frame 880 can have a frame first side 986 and a frame second side 988.

The frame platform 882 can have a platform first side 990 and a platform second side 992. The platform first side 990 can be along the frame first side 986. The platform second side 992 can be along the frame second side 988.

The frame base 884 can have a base first side 994 and a base second side 996. The base first side 994 can be along the frame first side 986. The base second side 996 can be along the frame second side 988. The platform first side 990 can be parallel with the base first side 994 and the platform second side 992 can be parallel with the base second side 996.

The lead frame 880 can have a frame recess 998 along the frame second side 988. The frame recess 998 is a space below the frame platform 882. The frame recess 998 can be located in the central portion of the lead frame 880.

The frame recess 998 can include the platform second side 992. The platform second side 992 can be exposed in the frame recess 998.

The lead frame 880 can include a frame wall 999. The frame wall 999 is the portion of the lead frame 880 that is between the frame platform 882 and the frame base 884. The frame wall 999 can be formed at an angle with the frame base 884 towards the frame platform 882.

The frame recess 998, the frame wall 999, and the frame platform 882 can be formed in a number of different ways. For example, the frame recess 998 and the frame platform 882 can be formed by a mechanical process, such as punching, stamping, forging, or pressing. As a further example, forming the frame wall 999 can produce artifacts, such as stress marks, due to deformation along the surface of the frame wall 999.

The elevated paddle 204 can be formed on the platform first side 990 of the frame platform 882. The elevated paddle 204 can be formed over a central portion of the frame platform 882.

The base pads 218 can be formed on the base first side 994 of the frame base 884. The first base pad 220 can be formed adjacent to and down set from the elevated paddle 204. The second base pad 222 can be formed adjacent to the first base pad 220 and on the side of the first base pad 220 opposite the elevated paddle 204. The third base pad 224 can be formed adjacent to the second base pad 222 and on the side of the second base pad 222 opposite the first base pad 220. The second base pad 222 can be between the first base pad 220 and the third base pad 224.

Figure 10:
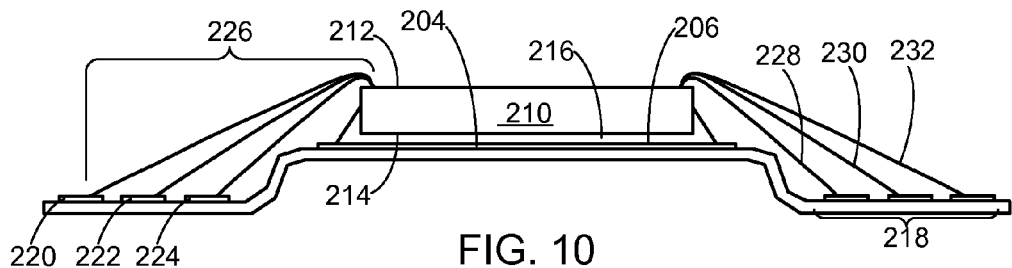
FIG. 10 is the structure of FIG. 9 in connecting the integrated circuit.

Referring now to FIG. 10, therein is shown the structure of FIG. 9 in connecting the integrated circuit 210. The adhesive 216 can be applied over the paddle first side 206 of the elevated paddle 204. The integrated circuit 210 can be mounted over the paddle first side 206 with the adhesive 216 in between.

The internal interconnects 226 can be connected between the base pads 218 and the integrated circuit 210. The internal interconnects 226 can include the first internal interconnect 228, the second internal interconnect 230, and the third internal interconnect 232. The first internal interconnect 228 can connect between the active side 212 of the integrated circuit 210 and the first base pad 220. The second internal interconnect 230 can connect between the active side 212 and the second base pad 222. The third internal interconnect 232 can connect between the active side 212 and the third base pad 224. Similarly, the elevated interconnects 562 of FIG. 5 can be connected between the active side 212 of the integrated circuit 210 and the elevated pads 560 of FIG. 5.

Figure 11:
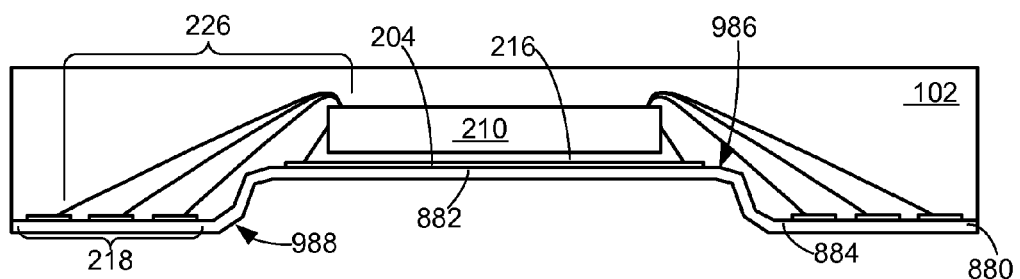
FIG. 11 is the structure of FIG. 10 in forming the encapsulation.

Referring now to FIG. 11, therein is shown the structure of FIG. 10 in forming the encapsulation 102. The encapsulation 102 can be formed over and conformal with the frame first side 986 of the lead frame 880. The encapsulation 102 can cover the frame base 884 and the frame platform 882. As an example, the encapsulation 102 can be only on the frame first side 986.

The encapsulation 102 can cover the elevated paddle 204 and the base pads 218. The encapsulation 102 can cover the integrated circuit 210, and the adhesive 216, and the internal interconnects 226. Similarly, the encapsulation 102 can cover the elevated pads 560 of FIG. 5 and the elevated interconnects 562 of FIG. 5.

Figure 12:
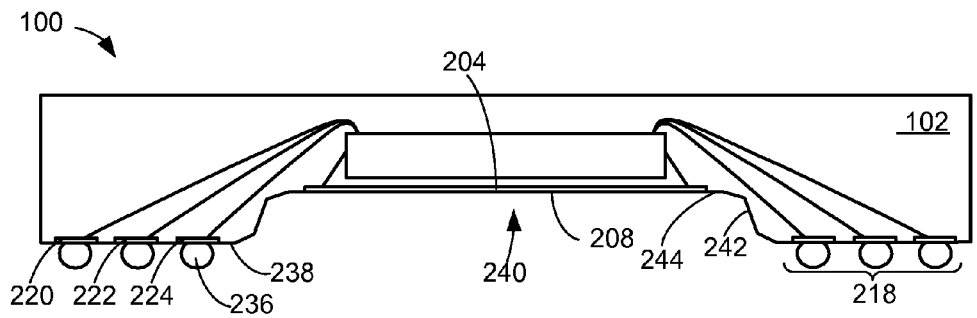
FIG. 12 is the structure of FIG. 11 in forming the integrated circuit packaging system.

Referring now to FIG. 12, therein is shown the structure of FIG. 11 in forming the integrated circuit packaging system 100. The lead frame 880 of FIG. 11 can be removed to form the integrated circuit packaging system 100.

The frame base 884 of FIG. 11 can be removed to expose the encapsulation base 238. Removing the frame base 884 can expose the base pads 218, including the first base pad 220, the second base pad 222, and the third base pad 224. The exposed portion of the base pads 218 can be co-planar with the encapsulation base 238 of the encapsulation 102.

The frame platform 882 of FIG. 11 can be removed to expose the encapsulation recess 240 having the recess side 242 and the recessed surface 244. Removing the frame platform 882 exposes the paddle second side 208 of the elevated paddle 204 in the encapsulation recess 240. The exposed portion of the paddle second side 208 can be co-planar with the recessed surface 244. Similarly, removing the lead frame 880 can expose the elevated pads 560 of FIG. 5 in the encapsulation recess 240.

The elevated paddle 204 and the base pads 218 can have the characteristics of the lead frame 880 removed. The characteristics of the lead frame 880 removed can include physical features, such as acid corrosion, irregularities in the surface, or a chemically processed surface.

The recess side 242 can have characteristics of the frame wall 999 of FIG. 9 removed. The characteristics of the frame wall 999 removed include physical features, such imprints or artifacts due to stress marks from deformed materials.

The lead frame 880, including the frame base 884, the frame wall 999, and the frame platform 882, can be removed by a number of different methods. For example, the lead frame 880 can be removed by chemical etching or stripping.

The external interconnects 234 can be attached to the base pads 218. The external interconnects 234 can be attached to the side of the first base pad 220, the second base pad 222, and the third base pad 224 that is exposed along the encapsulation base 238.

Figure 13:
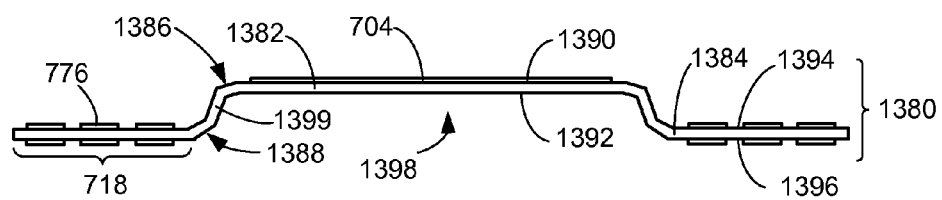
FIG. 13 is a cross-sectional view of a lead frame as exemplified by the isometric top view of FIG. 8 along line 9-9 of FIG. 8.

Referring now to FIG. 13, therein is shown a cross-sectional view of a lead frame 1380 as exemplified by the isometric top view of FIG. 8 along line 9-9 of FIG. 8. The lead frame 1380 is a malleable base structure that also provides sufficient rigidity to support build up and attachment of components for forming an integrated circuit packaging system. The lead frame 1380 can be removed through processes, such as etching, without damaging or removing components or structures formed over the lead frame 1380.

As an example, the lead frame 1380 can be a structure formed from metals, such as copper, a copper alloy, or other alloys. As a further example, the lead frame 1380 can be made from a single continuous piece of material without cutouts, openings, or tie bars.

The lead frame 1380 can have a frame first side 1386 and a frame second side 1388. The lead frame 1380 can include a frame platform 1382 and a frame base 1384.

The frame platform 1382 can have a platform first side 1390 and a platform second side 1392. The platform first side 1390 can be along the frame first side 1386. The platform second side 1392 can be along the frame second side 1388.

The frame base 1384 can have a base first side 1394 and a base second side 1396. The base first side 1394 can be along the frame first side 1386. The base second side 1396 can be along the frame second side 1388. The platform first side 1390 can be parallel with the base first side 1394 and the platform second side 1392 can be parallel with the base second side 1396.

The lead frame 1380 can have a frame recess 1398 along the frame second side 1388. The frame recess 1398 is a space below the frame platform 1382. The frame recess 1398 can be located in the central portion of the lead frame 1380.

The frame recess 1398 can include the platform second side 1392. The platform second side 1392 can be exposed in the frame recess 1398.

The lead frame 1380 can include a frame wall 1399. The frame wall 1399 is the portion of the lead frame 1380 that is between the frame platform 1382 and the frame base 1384. The frame wall 1399 can be formed at an angle with the frame base 1384 towards the frame platform 1382.

The frame recess 1398 and the frame platform 1382 can be formed in a number of different ways. For example, the frame recess 1398 and the frame platform 1382 can be formed by a mechanical process, such as punching, stamping, forging, or pressing. As a further example, forming the frame wall 1399 can produce artifacts, such as stress marks, due to deformation along the surface of the frame wall 1399.

The elevated paddle 704 can be formed on the platform first side 1390 of the frame platform 1382. The elevated paddle 704 can be formed over a central portion of the frame platform 1382.

The elevated paddle 704 can be formed in a number of different ways. For example, the elevated paddle 704 can be formed by a plating or layering process, such as chemical vapor deposition, electroplating, physical vapor deposition, sputtering, or spraying processes.

The inner pads 776 can be formed over the base first side 1394 of the frame base 1384. The base pads 718 can be formed on the base second side 1396 of the frame base 1384. Each of the base pads 718 can be formed to be directly below each of the inner pads 776.

The base pads 718 and the inner pads 776 can be formed in a number of different ways. For example, the base pads 718 and the inner pads 776 can be formed by a plating or layering process, such as chemical vapor deposition, electroplating, physical vapor deposition, sputtering, spraying processes, or by a process that is the same or similar to the process used to form the elevated paddle 704. As a further example, the base pads 718 and the inner pads 776 can be formed at the same time that the elevated paddle 704 is formed or, alternatively, the base pads 718 and the inner pads 776 can be formed before or after the elevated paddle 704 is formed.

Figure 14:
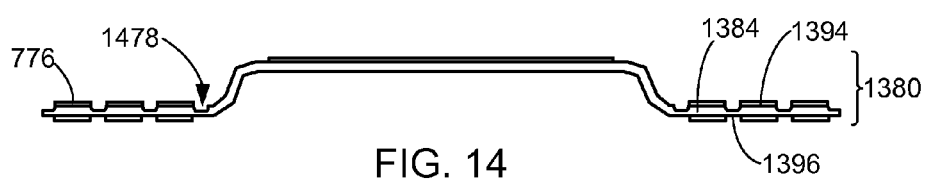
FIG. 14 is the structure of FIG. 13 in forming grooves.

Referring now to FIG. 14, therein is shown the structure of FIG. 13 in forming grooves 1478. The grooves 1478 are formed in the frame base 1384 of the lead frame 1380 along the base first side 1394 of the frame base 1384. The grooves 1478 are formed along lateral sides of the inner pads 776. The grooves 1478 do not traverse to the base second side 1396.

The grooves 1478 can be formed in a number of different ways. For example, the grooves 1478 can be formed by physical processes, such as grinding or routing, or by chemical processes, such as chemical etching or chemical stripping.

Figure 15:
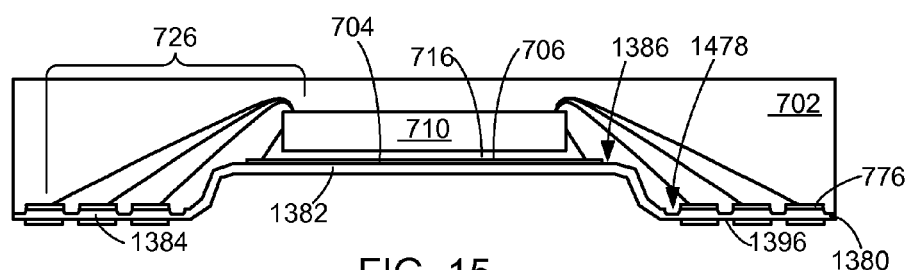
FIG. 15 is shown the structure of FIG. 14 in connecting the integrated circuit.

Referring now to FIG. 15, therein is shown the structure of FIG. 14 in connecting the integrated circuit 710. The adhesive 716 can be applied over the paddle first side 706 of the elevated paddle 704. The integrated circuit 710 can be mounted over the paddle first side 706 with the adhesive 716 in between.

The internal interconnects 726 can be connected between the inner pads 776 and the integrated circuit 710. The internal interconnects 726 can connect between the active side 712 of the integrated circuit 710 and side of the inner pads 776 facing away from the base second side 1396.

The encapsulation 702 can be formed over and conformal with the frame first side 1386 of the lead frame 1380. The encapsulation 702 can cover the frame base 1384 and the frame platform 1382. As an example, the encapsulation 702 can be only on the frame first side 1386.

The encapsulation 702 can cover the elevated paddle 704 and the inner pads 776. The encapsulation 702 can cover the integrated circuit 710, and the adhesive 716, and the internal interconnects 726. The encapsulation 702 can fill the grooves 1478.

Figure 16:
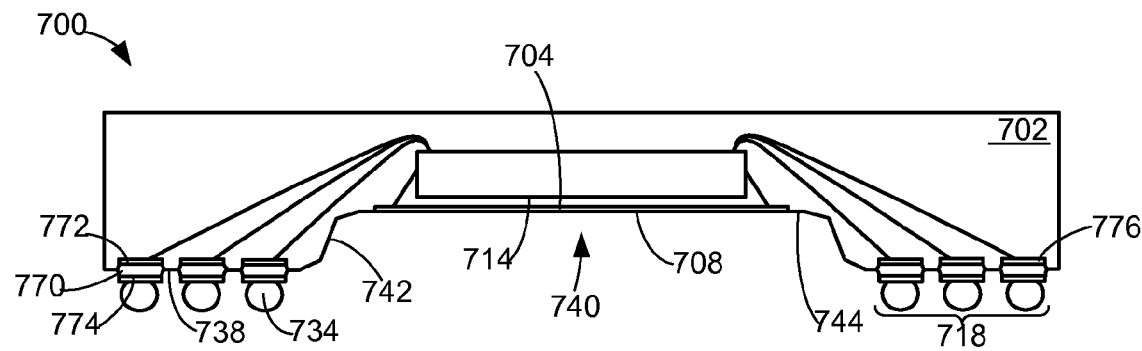
FIG. 16 is shown the structure of FIG. 15 in forming the integrated circuit packaging system.

Referring now to FIG. 16, therein is shown the structure of FIG. 15 in forming the integrated circuit packaging system 700. The lead frame 1380 of FIG. 15 can be removed to form the integrated circuit packaging system 700.

The frame base 1384 of FIG. 15 can be removed to expose the encapsulation base 738. Removing the portion of the frame base 1384 of FIG. 15 below the grooves 1478 of FIG. 15 can form the pillars 770 having the inner side 772 and the outer side 774. A portion of the pillars 770 can protrude from the encapsulation base 738.

The base pads 718 can be on the outer side 774 the pillars 770 facing away from the encapsulation base 738. The inner pads 776 can be on the inner side 772 of the pillars 770 opposite the base pads 718.

The frame platform 1382 of FIG. 15 can be removed to expose the encapsulation recess 740 having the recess side 742 and the recessed surface 744. Removing the frame platform 1382 exposes the paddle second side 708 of the elevated paddle 704 in the encapsulation recess 740. The exposed portion of the paddle second side 708 can be co-planar with the recessed surface 744.

The elevated paddle 704 and the base pads 718 can have the characteristics of the lead frame 1380 removed. The characteristics of the lead frame 780 removed can include physical features, such as acid corrosion, irregularities in the surface, or a chemically processed surface.

The recess side 742 can have characteristics of the frame wall 1399 of FIG. 13 removed. The characteristics of the frame wall 1399 removed include physical features, such imprints or artifacts due to stress marks from deformed materials.

The lead frame 1380, including the frame base 1384, the frame wall 1399, and the frame platform 1382, can be removed by a number of different methods. For example, the lead frame 1380 can be removed by chemical etching or stripping.

The external interconnects 734 can be attached to the base pads 718. The external interconnects 734 can be attached to the side of the first base pad 720, the second base pad 722, and the third base pad 724 that is exposed along the encapsulation base 738.

Figure 17:
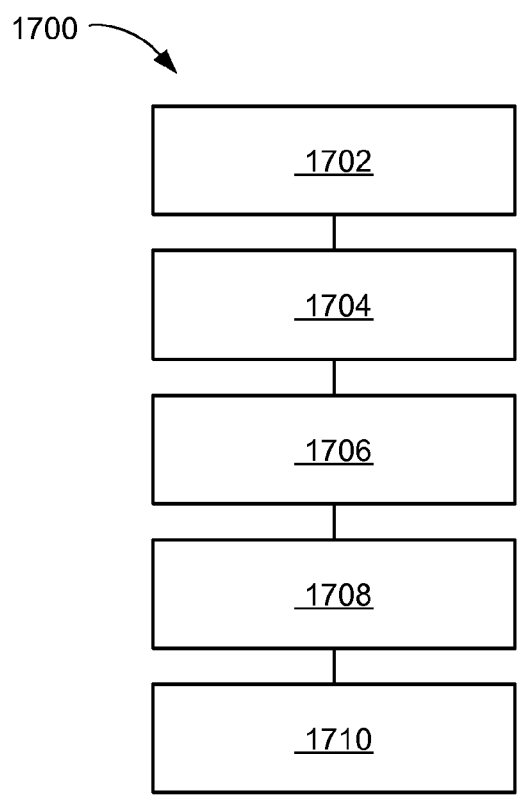
FIG. 17 is a flow chart of a method of manufacture of the integrated circuit packaging system in a further embodiment of the present invention.

Referring now to FIG. 17, therein is shown a flow chart of a method 1700 of manufacture of the integrated circuit packaging system 100 in a further embodiment of the present invention. The method 1700 includes: providing a lead frame having a frame platform and a frame base in a block 1702; forming an elevated paddle on the frame platform and a base pad on the frame base in a block 1704; mounting an integrated circuit over the elevated paddle in a block 1706; forming an encapsulation on the lead frame and over the elevated paddle, the base pad, the integrated circuit, and the internal interconnect in a block 1708; and removing the lead frame to expose an encapsulation recess and an encapsulation base with the base pad exposed along the encapsulation base and the elevated paddle exposed in the encapsulation recess in a block 1710.

Thus, it has been discovered that the integrated circuit packaging system of the present invention furnish or furnishes important and heretofore unknown and unavailable solutions, capabilities, and functional aspects for pads. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead frame having a frame platform and a frame base;
   forming an elevated paddle on the frame platform and a base pad on the frame base;
   mounting an integrated circuit over the elevated paddle;
   forming an encapsulation on the lead frame and over the elevated paddle, the base pad, and the integrated circuit; and
   removing the lead frame to expose an encapsulation recess and an encapsulation base with the base pad exposed along the encapsulation base, the elevated paddle exposed in the encapsulation recess, the encapsulation recess with a recess side between a recessed surface and the encapsulation base, and the recess side non-horizontal and continuously exposed around the encapsulation recess.

2. The method as claimed in claim 1 further comprising:
   forming an elevated pad on the frame platform adjacent to the base pad; and
   wherein removing the lead frame includes removing the lead frame to expose the elevated pad in the encapsulation recess.

3. The method as claimed in claim 1 wherein removing the lead frame includes forming a pillar protruding from the encapsulation base with the base pad on a side of the pillar facing away from the encapsulation base.

4. The method as claimed in claim 1 further comprising connecting a base device in the encapsulation recess and along a recessed surface of the encapsulation recess.

5. The method as claimed in claim 1 further comprising providing a base substrate having a base device thereover with the base device in the encapsulation recess.

6. A method of manufacture of an integrated circuit packaging system comprising:
   providing a lead frame having a frame platform and a frame base down set from the frame platform;
   forming an elevated paddle on the frame platform and a base pad on the frame base with the base pad adjacent to and down set from the elevated paddle;
   mounting an integrated circuit over the elevated paddle;
   forming an encapsulation on the lead frame and over the elevated paddle, the base pad, and the integrated circuit; and
   removing the lead frame to expose an encapsulation recess and an encapsulation base with the base pad exposed along the encapsulation base, the elevated paddle exposed in the encapsulation recess, the encapsulation recess with a recess side between a recessed surface and the encapsulation base, and the recess side non-horizontal and continuously exposed around the encapsulation recess.

7. The method as claimed in claim 6 wherein removing the lead frame to expose the encapsulation recess includes exposing a recessed surface in the encapsulation recess co-planar with the elevated paddle.

8. The method as claimed in claim 6 wherein removing the lead frame to expose the encapsulation recess includes exposing the encapsulation between a base pad and a further base pad.

9. The method as claimed in claim 6 wherein removing the lead frame to expose the encapsulation recess includes exposing the encapsulation recess at a central portion of the encapsulation base.

10. The method as claimed in claim 6 wherein forming the elevated paddle and the base pad includes forming the elevated paddle and the base pad from at least one plated metal layer.

11. An integrated circuit packaging system comprising:
    an elevated paddle;
    an integrated circuit on the elevated paddle;
    a base pad adjacent to and down set from the elevated paddle; and
    an encapsulation, having an encapsulation recess in an encapsulation base, over the integrated circuit, the elevated paddle exposed in the encapsulation recess, the base pad exposed along the encapsulation base, the encapsulation recess with a recess side between a recessed surface and the encapsulation base, and the recess side non-horizontal and continuously exposed around the encapsulation recess.

12. The system as claimed in claim 11 further comprising an elevated pad adjacent to the elevated paddle and exposed in the encapsulation recess.

13. The system as claimed in claim 11 further comprising a pillar protruding from the encapsulation base with the base pad on the side of the pillar facing away from the encapsulation base.

14. The system as claimed in claim 11 wherein the elevated paddle and the base pad have characteristics of a lead frame removed.

15. The system as claimed in claim 11 further comprising a base device in the encapsulation recess.

16. The system as claimed in claim 11 wherein the encapsulation base surrounds the encapsulation recess.

17. The system as claimed in claim 16 further comprising:
    a recessed surface in the encapsulation recess; and
    wherein:
    the elevated paddle is co-planar with the recessed surface.

18. The system as claimed in claim 16 wherein the encapsulation recess is between the base pad and a further of the base pad.

19. The system as claimed in claim 16 wherein the encapsulation recess is at a central portion of the encapsulation base.

20. The system as claimed in claim 16 wherein the elevated paddle and the base pad are formed from at least one plated metal layer.

* * * * *